United States Patent
Kim et al.

(10) Patent No.: US 8,419,978 B2
(45) Date of Patent: *Apr. 16, 2013

(54) ANISOTROPIC CONDUCTIVE FILM COMPOSITION

(75) Inventors: Hyoun Young Kim, Siheung-si (KR); Chang Bum Chung, Yongin-si (KR); Jeong Ku Kang, Seoul (KR); Jung Sik Choi, Suwon-si (KR)

(73) Assignee: Cheil Industries, Inc., Gumi-si, Gyeongsangbuk-do (KR)

( * ) Notice: Subject to any disclaimer, the term of this patent is extended or adjusted under 35 U.S.C. 154(b) by 141 days.

This patent is subject to a terminal disclaimer.

(21) Appl. No.: 13/016,292

(22) Filed: Jan. 28, 2011

(65) Prior Publication Data

US 2011/0133130 A1    Jun. 9, 2011

Related U.S. Application Data

(62) Division of application No. 11/907,812, filed on Oct. 17, 2007, now Pat. No. 7,879,259.

(30) Foreign Application Priority Data

Oct. 31, 2006 (KR) .................. 10-2006-0106239

(51) Int. Cl.
*H01B 1/00* (2006.01)
*H01B 1/04* (2006.01)
*H01B 1/22* (2006.01)
*H01B 1/02* (2006.01)

(52) U.S. Cl.
USPC ........... 252/500; 252/502; 252/513; 252/514

(58) Field of Classification Search ........ 252/500–521.6
See application file for complete search history.

(56) References Cited

U.S. PATENT DOCUMENTS

| | | | | |
|---|---|---|---|---|
| 5,651,922 A | * | 7/1997 | Nahass et al. | ................. 252/511 |
| 6,905,637 B2 | * | 6/2005 | Yeager et al. | ................. 252/511 |
| 7,410,698 B2 | * | 8/2008 | Ishida et al. | ................. 428/403 |
| 2002/0177027 A1 | | 11/2002 | Yeager et al. | |
| 2009/0309220 A1 | | 12/2009 | Katogi et al. | |

FOREIGN PATENT DOCUMENTS

WO    WO 2006/098352 A1    9/2006

* cited by examiner

*Primary Examiner* — Mark Kopec
*Assistant Examiner* — Jaison Thomas
(74) *Attorney, Agent, or Firm* — Lee & Morse, P.C.

(57) ABSTRACT

An anisotropic conductive film (ACF) composition includes a binder having a thermoplastic resin and a styrene-acrylonitrile (SAN) copolymer resin, a curing composition, and conductive particles.

5 Claims, No Drawings

ANISOTROPIC CONDUCTIVE FILM COMPOSITION

CROSS REFERENCE TO RELATED APPLICATION

This is a divisional application based on application Ser. No. 11/907,812, filed Oct. 17, 2007, now U.S. Pat. No. 7,879,259, the entire contents of which is hereby incorporated by reference.

BACKGROUND OF THE INVENTION

1. Field of the Invention

Embodiments of the present invention relate to an anisotropic conductive film composition. More particularly, embodiments of the present invention relate to an anisotropic conductive film composition including a styrene-acrylonitrile copolymer and exhibiting improved adhesion and low contact resistance characteristics.

2. Description of the Related Art

In general, an anisotropic conductive film (ACF) refers to a film-type adhesive having conductive particles dispersed in an insulating adhesive binder. As such, the ACF may provide connections between electrical components, e.g., semiconductor elements, circuits, and so forth. More specifically, the ACF may be compressed between electrical components, so the conductive particles may establish an electrical connection therebetween, and the insulting adhesive binder may flow away from the electrical components to provide an insulating coating around the resultant electrical connection. The binder may also provide mechanical bonding between the electrical components. Accordingly, the ACF may be used for electrical connection in, e.g., liquid crystal displays (LCDs), tape carrier packages (TCPs), printed circuit boards (PCBs), and so forth.

Conventional ACFs may include a binder, e.g., an epoxy-based binder or a (meth)acrylate-based binder, mixed with a curing agent. However, the conventional epoxy-based and/or (meth)acrylate-based binder may exhibit insufficient adhesive properties and a relatively low glass transition temperature, thereby imparting poor mechanical connection and adhesion reliability to the conventional ACF.

In addition to insufficient adhesive properties, the epoxy-based binder may require high curing temperature and long curing time, thereby imparting low long-term reliability to the ACF. With respect to the (meth)acrylate-based binder, in addition to insufficient adhesive properties, the (meth)acrylate-based binder may exhibit low heat and moisture resistance. Additionally, the (meth)acrylate-based binder may have different flow properties with respect to the curing agent due to different rheology characteristic thereof, thereby causing either excessive generation of foam upon low curing rate or low conductivity upon high curing rate, which in turn, may result in either low reliability or low conductivity, respectively.

SUMMARY OF THE INVENTION

Embodiments of the present invention are therefore directed to an anisotropic conductive film composition, which substantially overcomes one or more of the disadvantages of the related art.

It is therefore a feature of an embodiment of the present invention to provide an anisotropic conductive film composition with a styrene-acrylonitrile copolymer exhibiting improved adhesion and low contact resistance characteristics.

It is another feature of an embodiment of the present invention to provide a method of manufacturing an anisotropic conductive film composition with a styrene-acrylonitrile copolymer exhibiting improved adhesion and low contact resistance characteristics.

At least one of the above and other features and advantages of the present invention may be realized by providing an anisotropic conductive film (ACF) composition, including a binder with a thermoplastic resin and a styrene-acrylonitrile (SAN) copolymer resin, a curing composition, and conductive particles.

The curing composition may include at least one (meth)acrylate oligomer, at least one (meth)acrylate monomer, and at least one radical initiator. The thermoplastic resin may be in an amount of about 5 wt % to about 50 wt % by weight of the ACF composition, the SAN copolymer may be in an amount of about 5 wt % to about 50 wt % by weight of the ACF composition, the (meth)acrylate oligomer may be in an amount of about 1 wt % to about 50 wt % by weight of the ACF composition, the (meth)acrylate monomer may be in an amount of about 1 wt % to about 30 wt % by weight of the ACF composition, the radical initiator may be in an amount of about 0.1 wt % to about 15 wt % by weight of the ACF composition, and the conductive particles may be in an amount of about 0.01 wt % to about 20 wt % by weight of the ACF composition. The radical initiator may be a light curing initiator or a heat curing initiator.

The (meth)acrylate oligomer may include one or more of urethane-based (meth)acrylate, epoxy-based (meth)acrylate, polyester-based (meth)acrylate, fluorine-based (meth)acrylate, fluorene-based (meth)acrylate, silicon-based (meth)acrylate, phosphate-based (meth)acrylate, maleimide modified (meth)acrylate, and/or acrylate(methacrylate), and may have an average molecular weight of about 1,000 to about 100,000. The (meth)acrylate monomer may include one or more of 1,6-hexanediol mono(meth)acrylate, 2-hydroxyethyl (meth)acrylate, 2-hydroxypropyl(meth)acrylate, 2-hydroxybutyl(meth)acrylate, 2-hydroxy-3-phenyloxypropyl(meth) acrylate, 1,4-butanediol(meth)acrylate, 2-hydroxyalkyl (meth)acryloyl phosphate, 4-hydroxy cyclohexyl(meth) acrylate, neopentylglycol mono(meth)acrylate, trimethylolethane di(meth)acrylate, trimethylolpropane di(meth)acrylate, pentaerythritol tri(meth)acrylate, dipentaerythritol penta(meth)acrylate, pentaerythritol hexa(meth) acrylate, dipentaerythritol hexa(meth)acrylate, glycerine di(meth)acrylate, t-hydroperfuryl(meth)acrylate, isodecyl (meth)acrylate, 2-(2-ethoxyethoxy) ethyl(meth)acrylate, stearyl(meth)acrylate, lauryl(meth)acrylate, 2-phenoxyethyl (meth)acrylate, isobornyl(meth)acrylate, tridecyl(meth)acrylate, ethoxylated nonylphenol(meth)acrylate, ethylene glycol di(meth)acrylate, diethylene glycol di(meth)acrylate, triethylene glycol di(meth)acrylate, t-ethylene glycol di(meth) acrylate, polyethylene glycol di(meth)acrylate, 1,3-butylene glycol di(meth)acrylate, tripropylene glycol di(meth)acrylate, ethoxylated bisphenol-A di(meth)acrylate, cyclohexanedimethanol di(meth)acrylate, phenoxy-t-glycol(meth) acrylate, 2-methacryloyloxyethyl phosphate, dimethylol tricyclodecane di(meth)acrylate, trimethylolpropane benzoate acrylate, and/or fluorene-based (meth)acrylate. The (meth)acrylate oligomer and/or the (meth)acrylate monomer may include a fluorene-based (meth)acrylate.

The (meth)acrylate oligomer and/or the (meth)acrylate monomer may include a fluorene-based epoxy(meth)acrylate represented by formula (2) below

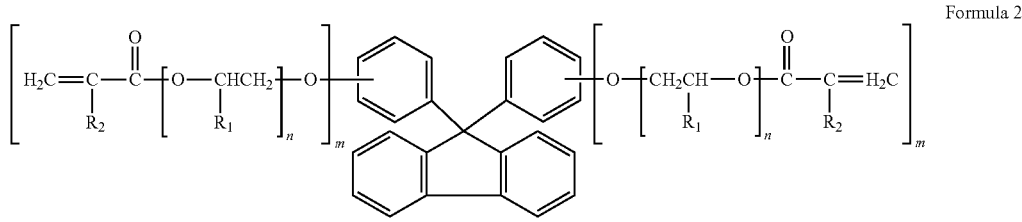

Formula 2 wherein each of $R_1$ and $R_2$ may be independently hydrogen or methyl, each n may be independently an integer from 0 to 15, and each m may be independently an integer from 2 to 4, or a fluorene-based urethane(meth)acrylate represented by formula (3) below,

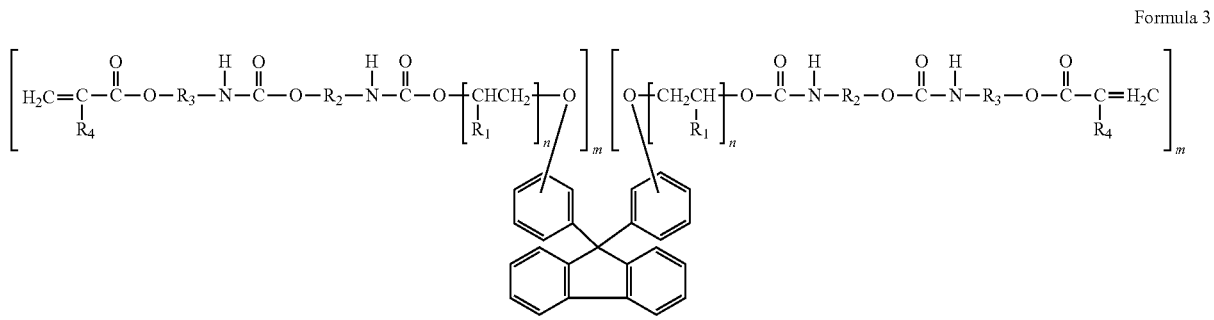

Formula 3 wherein each of $R_1$ and $R_4$ may be independently hydrogen or methyl, each of $R_2$ and $R_3$ may be independently a $C_{1-20}$ aliphatic or $C_{5-20}$ alicyclic or aromatic group, each n may be independently an integer from 1 to 5, and each m may be independently an integer from 2 to 5.

The curing composition may include at least one epoxy component and at least one heat curing agent. The thermoplastic resin may be in an amount of about 5 wt % to about 50 wt % by weight of the ACF composition, the SAN copolymer may be in an amount of about 5 wt % to about 50 wt % by weight of the ACF composition, the epoxy component may be in an amount of about 1 wt % to about 80 wt % by weight of the ACF composition, the heat curing agent may be in an amount of about 0.1 wt % to about 15 wt % by weight of the ACF composition, and the conductive particles may be in an amount of about 0.01 wt % to about 20 wt % by weight of the ACF composition. The epoxy component may include one or more of bisphenol epoxy, novolac epoxy, glycidyl epoxy, an aliphatic epoxy, and/or an alicyclic epoxy. The epoxy component may include one or more of a solid-phase epoxy, a liquid-phase epoxy, and/or a soluble epoxy. The heat curing agent may be one or more of acid anhydride derivative, amine based derivative, imidazole based derivative, hydrazide based derivative.

The SAN copolymer may have a glass transition temperature of about 100° C. to 200° C. The SAN copolymer may have an average molecular weight of about 5,000 to about 200,000. The thermoplastic resin may have an average molecular weight of about 1,000 to about 1,000,000, and may include one or more of an acrylonitrile-based resin, a butadiene-based resin, an acryl-based resin, a urethane-based resin, an epoxy based resin, a phenoxy-based resin, a polyamide-based resin, an olefin-based resin, and/or a silicon-based resin. The conductive particles may include metal particles, crystalline carbon particles, amorphous carbon particles, metal coated polymeric particles, and/or insulation-coated conductive particles. The ACF composition may further include at least one additive in an amount of about 0.1 wt % to about 10 wt % by weight of the ACF composition. The additive may be one or more of a polymerization inhibitor, an antioxidant, a heat stabilizer, and/or a curing accelerator.

At least one of the above and other features and advantages of the present invention may be further realized by providing a method of manufacturing an anisotropic conductive film (ACF) composition, including forming a binder with a thermoplastic resin and a styrene-acrylonitrile (SAN) copolymer resin, and adding a curing composition and conductive particles to the binder.

At least one of the above and other features and advantages of the present invention may be further realized by providing an anisotropic conductive film (ACF), including a release layer, and a film composition on the release layer, the composition including a thermoplastic resin, a styrene-acrylonitrile (SAN) copolymer resin, a curing composition, and conductive particles.

DETAILED DESCRIPTION OF THE INVENTION

Korean Patent Application No. 10-2006-0106239, filed on Oct. 31, 2006, in the Korean Intellectual Property Office, and entitled: "Anisotropic Conductive Film Composition Using Styrene-Acrylonitrile Copolymer for High Reliability," is incorporated by reference herein in its entirety.

Exemplary embodiments of the present invention will now be described more fully hereinafter. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

An anisotropic conductive film (ACF) composition according to an embodiment of the present invention may include a binder to provide a matrix for film formation, a curing composition to impart adhesion to the ACF, and conductive particles to provide conductivity to the ACF. The curing composition of the ACF composition may be either a radical curing composition or an epoxy curing composition. Accordingly, hereinafter, an ACF composition including a radical curing composition will be referred to as a radical ACF composition and an ACF composition including an epoxy curing composition will be referred to as an epoxy ACF composition.

The radical ACF composition may include a binder having at least one thermoplastic resin and at least one styrene-acrylonitrile (SAN) copolymer resin, a radical curing composition having at least one (meth)acrylate oligomer, at least one (meth)acrylate monomer, and at least one radical initiator, and conductive particles. More specifically, the radical ACF composition may include about 5 to 50 wt % of a thermoplastic resin, about 5 to 50 wt % of a SAN copolymer resin, about 1 to 50 wt % of a (meth)acrylate oligomer, about 1 to 30 wt % of a (meth)acrylate monomer, about 0.1 to 15 wt % of a radical initiator, and about 0.01 to 20 wt % of conductive particles. Unless indicated otherwise, all percentages refer hereinafter to weight percentages based on a total weight of the ACF composition, i.e., either a radical ACF composition or an epoxy ACF composition. It is further noted that unless indicated otherwise, all references to "(meth)acrylate" compounds include methacrylate and/or acrylate compounds.

The epoxy ACF composition may include a binder having at least one thermoplastic resin and at least one SAN copolymer resin, an epoxy curing composition having at least one epoxy-based components and at least one heat curing agent, and conductive particles. More specifically, the epoxy ACF composition may include about 5 to 50 wt % of a thermoplastic resin, about 5 to 50 wt % of a SAN copolymer resin, about 1 to 80 wt % of at least one epoxy-based component, about 0.1 to 15 wt % of a heat curing agent, and about 0.01 to 20 wt % of conductive particles. The epoxy-based component may be one or more of an epoxy monomer, an epoxy oligomer, and/or an epoxy resin. In other words, the epoxy-based component may include one or more of a bisphenol-based component, a novolac component, a glycidyl-type component, an aliphatic-type component, and/or an alicyclic-type component.

The ACF composition, i.e., either a radical ACF composition or an epoxy ACF composition, according to an embodiment of the present invention may be advantageous, as compared to conventional ACF compositions, because use of the SAN copolymer resin in the binder may impart high charging density, superior heat resistance, improved chemical resistance and mechanical properties, increased adhesion properties, and low contact resistance to an ACF. Additionally, the ACF composition according to an embodiment of the present invention may maintain its superior characteristics at high temperature and humidity conditions and/or under a thermal shock condition, thereby providing good adhesion reliability to, e.g., zinc, copper, polyimide, and so forth. As such, an ACF formed of an ACF composition according to embodiments of the present invention may improve productivity of, e.g., semiconductors.

Hereinafter, a detailed description of each of the radical and epoxy ACF compositions will be described according to embodiments of the present invention. It should be noted that hereinafter, unless indicated otherwise, an "ACF composition" may refer to either one or both of the radical ACF composition or the epoxy ACF composition.

The Radical ACF Composition:
The radical ACF composition may include a binder, a radical curing composition, and conductive particles.

The Binder:
The binder may include at least one thermoplastic resin and at least one SAN copolymer resin. The thermoplastic resin may provide a matrix for film formation, and may be present in the composition in an amount of about 5 wt % to about 50 wt % of the ACF composition. The thermoplastic resin may include one or more of an acrylonitrile-based resin, a butadiene-based resin, a acryl-based resin, a urethane-based resin, an epoxy-based resin, a phenoxy-based resin, a polyamide-based resin, an olefin-based resin, and/or a silicon-based resin. For example, the thermoplastic resin may be one or more of polyvinyl butyral, polyvinyl formal, polyester, phenol resin, epoxy resin, phenoxy resin, an acryl-based resin, and so forth.

The thermoplastic resin may have an average molecular weight ranging from about 1,000 to about 1,000,000. When the thermoplastic resin has a molecular weight lower than about 1,000, excess tack may be formed, thereby reducing strength and stability of the binder. When the thermoplastic resin has a molecular weight higher than about 1,000,000, compatibility thereof with the curing composition, e.g., (meth)acrylate oligomer and/or epoxy resin, may be reduced, thereby causing phase separation. In this respect, it is noted that the "molecular weight" refers to weight average molecular weight.

The SAN copolymer resin may be employed due to its transparency, good heat and chemical resistances, superior electrical and mechanical properties, dimensional stability, relative low solubility, and so forth. The SAN copolymer may include at least one styrene monomer and at least one acrylonitrile monomer polymerized into a copolymer by, e.g., emulsion polymerization, suspension polymerization, bulk polymerization, and so forth. In is noted that the terms "styrene-acrylonitrile copolymer," "SAN copolymer," "SAN copolymer resin," and so forth may be used interchangeably hereinafter.

More specifically, the SAN copolymer may include the styrene and acrylonitrile monomers in any suitable proportion determined by one of ordinary skill in the art, e.g., the SAN copolymer may include about 70 wt % to about 90 wt % styrene and about 10 wt % to about 30 wt % acrylonitrile based on the total weight of the SAN copolymer. Examples of suitable commercially available SAN copolymer resins may include AP series of SAN resin (Cheil Industries, Inc.), SAN series of SAN resin (Kumho Petrochemical Co., Ltd.), Lustran series of SAN resin (Bayer), Luran S series of acrylonitrile-styrene-acrylonitrile (ASA) resin (BASF), and so forth.

The SAN copolymer may be present in the ACF composition in an amount of about 5 wt % to about 50 wt % of the ACF composition. The amount of the SAN copolymer may be lower than an amount of the thermoplastic resin within the binder of the ACF, so a ratio of the SAN copolymer to the thermoplastic resin within the binder of the ACF may be about 10:90 to about 30:70 by weight. The SAN copolymer may have an average molecular weight of about 5,000 to about 200,000, and a glass transition temperature of about 100° C. or more, and preferably a glass transition temperature between about 100° C. to about 200° C., as measured by a differential scanning calorimeter (DSC). A molecular weight of the SAN copolymer below about 5,000 may form an insufficiently strong binder, while a molecular weight of the SAN copolymer above about 2000,000 may reduce compatibility thereof with the curing composition, thereby causing phase separation. A glass transition temperature below about 100° C. may reduce adhesion strength of the ACF. An ACF composition including the SAN copolymer resin in an amount below about 1 wt % may have reduced reliability, while an ACF composition including the SAN copolymer resin in an amount exceeding about 50 wt % may increase brittleness of an ACF formed of the ACF composition.

The Curing Composition:

A ratio of the curing composition with respect to the binder in the ACF composition may be about 60:40 to about 40:60 by weight of curing composition to weight of binder. The curing composition of the radical ACF composition may include at least one (meth)acrylate oligomer, at least one (meth)acrylate monomer, and at least one radical initiator. The (meth)acrylate oligomer may be present in the ACF composition in an amount of about 1 wt % to about 50 wt % of the ACF composition to facilitate a curing reaction of the ACF composition, thereby providing adhesion reliability between electrical components to be connected by the ACF. If the (meth) acrylate oligomer is used in excess of about 50 wt %, the curing reaction may trigger excessive crosslinking in the ACF film, thereby forming a highly rigid structure with increased shrinkage. The (meth)acrylate monomer may be present in the ACF composition in an amount of about 1 wt % to about 30 wt % of the ACF composition to function as a reactive diluent. The radical initiator may be present in the ACF composition in an amount of about 0.1 wt % to about 15 wt % of the ACF composition.

The (meth)acrylate oligomer of the curing composition may include any suitable (meth)acrylate oligomer having an average molecular weight of about 1,000 to about 100,000. For example, the (meth)acrylate oligomer may be one or more of urethane-based (meth)acrylate, epoxy based (meth)acrylate, polyester-based (meth)acrylate, fluorine-based (meth)acrylate, fluorene-based (meth)acrylate, silicon-based (meth)acrylate, phosphate-based (meth)acrylate, maleimide modified (meth)acrylate, and/or acrylate-methacrylate oligomer.

More specifically, if a urethane-based (meth)acrylate oligomer is employed in the curing composition of the radical ACF composition, one or more of polyester polyol; polyether polyol; polycarbonate polyol; polycaprolactone polyol; tetrahydrofurane-propyleneoxide ring opening copolymer; polybutadiene diol; polydimethylsiloxane diol; ethylene glycol; propylene glycol; 1,4-butanediol; 1,5-pentanediol; 1,6-hexanediol; neopentyl glycol; 1,4-cyclohexane dimethanol; bisphenol A; hydrogenated bisphenol A; 2,4-toluene diisocyanate; 1,3-xylene diisocyanate; 1,4-xylene diisocyanate; 1,5-naphthalene diisocyanate; 1,6-hexane diisocyanate; and/or isophorone diisocyanate, may be used.

If an epoxy(meth)acrylate oligomer is employed in the curing composition of the radical ACF composition, one or more of 2-bromohydroquinone; resorcinol; catechol; bisphenol, e.g., bisphenol A, bisphenol F, bisphenol AD, bisphenol S, and so forth; 4,4'-dihydroxybiphenyl; bis(4-hydroxyphenyl)ether; alkyl; aryl; methylol; allyl; alicyclic; halogen(tetrabromobisphenol A); and/or nitro, may be used.

If a maleimide modified (meth)acrylate oligomer is employed in the curing composition of the radical ACF composition, the (meth)acrylate oligomer may include at least two maleimide groups, e.g., 1-methyl-2,4-bismaleimidebenzene; N,N'-m-phenylenebismaleimide; N,N'-p-phenylenebismaleimide; N,N'-m-toylenebismaleimide; N,N'-4,4-biphenylenebismaleimide; N,N'-4,4-(3,3'-dimethylbiphenylene)bismaleimide; N,N'-4,4-(3,3'-dimethyldiphenylmethane)bismaleimide; N,N'-4,4-(3,3'-diethyldiphenylmethane)bismaleimide; N,N'-4,4-diphenylmethanebismaleimide; N,N'-4,4-diphenylpropanebismaleimide; N,N'-4,4-diphenyl ether bismaleimide; N,N'-3,3'-diphenylsulfone bismaleimide; 2,2-bis(4-(4-maleimidephenoxy)phenyl)propane; 2,2-bis(3-t-butyl-4-8(4-maleimidephenoxy) phenyl)propane; 1,1-bis(4-(4-maleimidephenoxy)phenyl)decane; 4,4'-cyclohexylidenebis(1-(4-maleimidephenoxy)-2-cyclohexylbenzene; 2,2-bis(4-(4-maleimidephenoxy)phenyl)hexafluoropropane; and so forth.

If a fluorene-based (meth)acrylate oligomer is employed in the curing composition of the radical ACF composition, one or more of a fluorene(meth)acrylate oligomer represented by the formula (1), a fluorene-based epoxy(meth)acrylate oligomer represented by the formula (2), and/or a fluorene-based urethane(meth)acrylate oligomer represented by the formula (3) may be used.

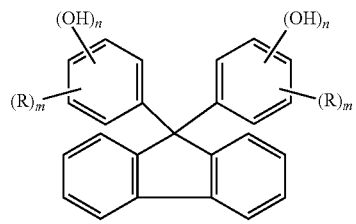

Formula 1

In formula (1) above, each R may be independently a $C_{1-20}$ alkyl, alkoxy, aryl, or cycloalkyl, each m may be independently an integer from 0 to 4, and each n may be independently an integer from 2 to 5.

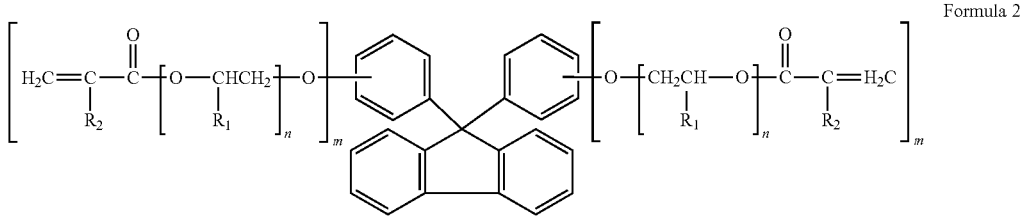

Formula 2

In formula (2) above, each of $R_1$ and $R_2$ may be independently hydrogen or methyl, each n may be independently an integer from 0 to 15, and each m may be independently an integer from 2 to 4.

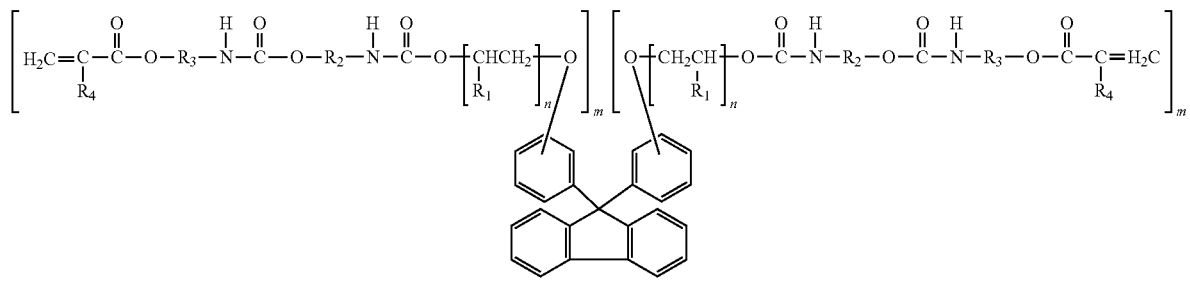

Formula 3

In formula (3) above, each of $R_1$ and $R_4$ may be independently hydrogen or methyl, each of $R_2$ and $R_3$ may be independently a $C_{1-20}$ aliphatic group, or a $C_{5-20}$ alicyclic or aromatic group, each n may be independently an integer from 1 to 5, and each m may be independently an integer from 2 to 5.

The fluorene derivative (meth)acrylate oligomer represented by formula (1) may be formed by generating an aryl radical, i.e., by reacting an aromatic diazoaluminum compound and a copper ion via a Pschorr reaction or by condensing a fluorenone formed by oxidizing fluorine with air and a phenol compound in the presence of a thiol compound. If the aryl radical is generated by condensing a fluorenone, the fluorine may be formed by reacting indene and butadiene via a Diels-Alder reaction, and the thiol compound may be, e.g., mercaptocarboxylic acid in a hydrochloric acid solution.

The fluorene-based epoxy(meth)acrylate oligomer represented by formula (2) may be formed by reacting a fluorene compound represented by formula (4) below with glycidyl (meth)acrylate in a predetermined solvent for about 5 to about 30 hours at a temperature of about 50° C. to about 120° C. The predetermined solvent may be, e.g., alkylene monoalkyl ether acetate, methyl ethyl ketone, and/or methyl amyl ketones.

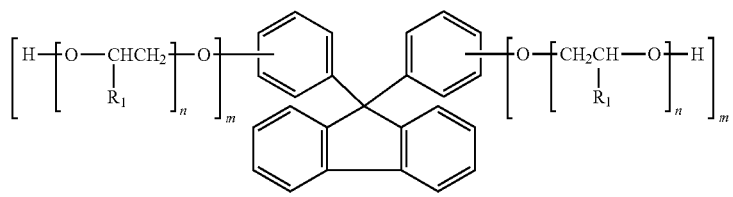

Formula 4

In formula 4 above, each $R_1$ may be independently hydrogen or methyl, each n may be independently an integer from 0 to 15, and each m may be independently an integer from 2 to 4.

The fluorene-based urethane(meth)acrylate oligomer represented by formula (3) may be formed by reacting a fluorene diol derivative represented by formula (5) below with diisocyanate and hydroxyl(meth)acrylate in ester. The ester may be, for example, alkylene monoalkyl ether acetate, e.g., methyl cellosolve acetate, propylene glycol monomethyl ether acetate, 3-methoxy butyl-1-acetate, and so forth.

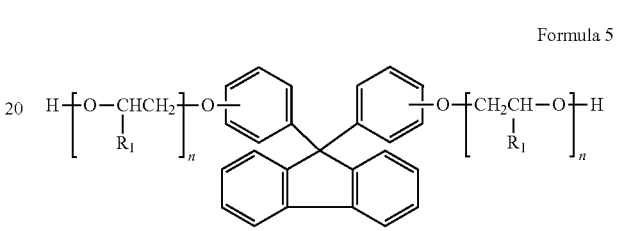

Formula 5

In formula 5 above, each $R_1$ may be independently hydrogen or methyl, and each n may be independently an integer from 1 to 5.

The (meth)acrylate monomer employed in the curing composition of the radical ACF composition may include any suitable (meth)acrylate monomer as determined by one of ordinary skill in the art. Examples of the (meth)acrylate monomer may include one or more of 1,6-hexanediol mono (meth)acrylate; 2-hydroxyethyl(meth)acrylate; 2-hydroxypropyl(meth)acrylate; 2-hydroxybutyl(meth)acrylate; 2-hydroxy-3-phenyloxypropyl(meth)acrylate; 1,4-butanediol (meth)acrylate; 2-hydroxyalkyl(meth)acryloyl phosphate; 4-hydroxycyclohexyl(meth)acrylate; neopentylglycol mono (meth)acrylate; trimethylolethane di(meth)acrylate; trimethylolpropane di(meth)acrylate; pentaerythritol tri(meth)acrylate; dipentaerythritol penta(meth)acrylate; pentaerythritol hexa(meth)acrylate; dipentaerythritol hexa (meth)acrylate; glycerine di(meth)acrylate; t-hydroperfuryl (meth)acrylate; isodecyl(meth)acrylate; 2-(2-ethoxyethoxy) ethyl(meth)acrylate; stearyl(meth)acrylate; lauryl(meth) acrylate; 2-phenoxyethyl(meth)acrylate; isobonyl(meth) acrylate; tridecyl(meth)acrylate; ethoxylated nonylphenol (meth)acrylate; ethylene glycol di(meth)acrylate; diethylene glycol di(meth)acrylate; triethylene glycol di(meth)acrylate; t-ethylene glycol di(meth)acrylate; polyethylene glycol di(meth)acrylate; 1,3-butylene glycol di(meth)acrylate; tripropylene glycol di(meth)acrylate; ethoxylated bisphenol-A di(meth)acrylate; cyclohexanedimethanol di(meth) acrylate; phenoxy-t-glycol(meth)acrylate; 2-methacryloyloxyethyl phosphate; dimethylol tricyclodecane di(meth)

acrylate; trimethyloipropane benzoate acrylate; and/or fluorene-based (meth)acrylate.

More specifically, if a fluorene-based epoxy(meth)acrylate monomer is employed in the curing composition of the radical ACF composition, the fluorene-based epoxy(meth)acrylate monomer represented by the formula (2) and/or the fluorene-based urethane(meth)acrylate monomer represented by the formula (3) may be used as the fluorene-based (meth)acrylate monomer. Example of commercially available fluorene-based (meth)acrylate monomers include BPEF-A (Osaka Gas).

Use of a fluorene-based (meth)acrylate oligomer or a (meth)acrylate monomer may minimize or prevent short circuits because of superior insulating properties imparted by the fluorene structure. Further, low initial contact resistance and high reliability may be provided, thereby improving productivity and reliability of the ACF.

The radical initiator employed in the curing composition of the radical ACF composition may include one or more of a light curing initiator and/or a heat curing initiator. Examples of the light curing initiator may include one or more of benzophenone, o-benzoylmethyl benzoate, 4-benzoyl-4-methyldiphenyl sulfide, isopropyl thioxanthone, diethyl thioxanthone, 4-diethylethyl benzoate, benzoin ether, benzoyl propyl ether, 2-hydroxy-2-methyl-1-phenyl propane-1-one, and/or diethoxy acetophenone.

The heat curing initiator may be either peroxide-based or azo-based. Examples of the peroxide-based heat curing initiator may include one or more of t-butylperoxylaurate; 1,1,3,3-t-methylbutylperoxy-2-ethyl hexanoate; 2,5-dimethyl-2,5-di(2-ethylhexanoylperoxy) hexane; 1-cyclohexyl-1-methylethylperoxy-2-ethyl hexanoate; 2,5-dimethyl-2,5-di(m-toluoylperoxy)hexane; t-butylperoxyisopropyl monocarbonate; t-butylperoxy-2-ethylhexyl monocarbonate; t-hexylperoxy benzoate; t-butylperoxy acetate; dicumyl peroxide; 2,5-dimethyl-2,5-di(t-butylperoxy)hexane; t-butylcumyl peroxide; t-hexylperoxy neodecanoate; t-hexylperoxy-2-ethyl hexanoate; t-butylperoxy-2-2-ethylhexanoate; t-butylperoxy isobutylate; 1,1-bis(t-butylperoxy)cyclohexane; t-hexylperoxyisopropyl monocarbonate; t-butylperoxy-3,5,5-trimethyl hexanoate; t-butylperoxy pivalate; cumylperoxy neodecanoate; di-isopropylbenzene hydroperoxide; cumene hydroperoxide; isobutyl peroxide; 2,4-dichlorobenzoyl peroxide; 3,5,5-trimethylhexanoyl peroxide; octanoyl peroxide; lauroyl peroxide; lauryl peroxide; stearyol peroxide; succinyl peroxide; benzoyl peroxide; 3,5,5-trimethylhexanoyl peroxide; benzoylperoxytoluene; 1,1,3,3-tetramethylbutylperoxy neodecanoate; 1-cyclohexyl-1-methylethylperoxy neodecanoate; di-n-propylperoxy dicarbonate; di-isopropylperoxy carbonate; bis(4-t-butyl cyclohexyl) peroxy dicarbonate; di-2-ethoxy methoxy peroxy dicarbonate; di(2-ethyl hexylperoxy)dicarbonate; dimethoxy butylperoxy dicarbonate; di(3-methyl-3-methoxy butylperoxy)dicarbonate; 1,1-bis(t-hexylperoxy)-3,3,5-trimethylcyclohexane; 1,1-bis(t-hexylperoxy)cyclohexane; 1,1-bis(t-butylperoxy)-3,3,5-trimethyl cyclohexane; 1,1-(t-butylperoxy)cyclododecane; 2,2-bis(t-butylperoxy)decane; t-butyltrimethylsilyl peroxide; bis(t-butyl)dimethylsilyl peroxide; t-butyltriallylsilyl peroxide; bis(t-butyl)diallylsilyl peroxide; and/or tris(t-butyl)arylsilyl peroxide. Examples of the azo-based heat initiator may include one or more of 2,2'-azobis(4-methoxy-2,4-dimethylvaleronitrile); dimethyl-2,2'-azobis(2-methylpropionate); 2,2'-azobis(N-cyclohexyl-2-methylpropionamide); 2,2-azobis(2,4-dimethylvaleronitrile); 2,2'-azobis(2-methylbutyronitrile); 2,2'-azobis[N-(2-propenyl)-2-methylpropionamide]; 2,2'-azobis(N-butyl-2-methylpropionamide); 2,2'-azobis[N-(2-propenyl)-2-methylpropionamide]; 1,1'-azobis(cyclohexane-1-carbonitrile); and/or 1-[(cyano-1-methylethyl)azo] formamide.

Conductive Particles:

The conductive particles of the ACF composition may be used as a filler therein for imparting conducting properties to ACF composition. variety of suitable conductive particles may be used. Example of conductive particles may include metal particles, e.g., gold (Au), silver (Ag), nickel (Ni), copper (Cu), solder, crystalline or amorphous carbon particles, resin-based particles, e.g., polyethylene, polypropylene, polyester, polystyrene, polyvinylalcohol based particles, metal coated particles, and insulation-coated conductive particles and so forth. The conductive particles may have a diameter size of about 2 μm to about 30 μm, and may be used as determined with respect to a pitch size of a corresponding circuit. The conductive particles may be present in the ACF composition in an amount of about 0.01 wt % to about 20 wt % of the ACF composition.

The Epoxy ACF Composition:

The epoxy ACF composition may be substantially similar to the radical ACF composition, with the exception of having a different curing composition. In other words, the epoxy ACF composition may include the binder, an epoxy curing composition, and the conductive particles. The binder and conductive particles of the epoxy ACF composition may be substantially identical to the binder and conductive particles described previously with respect to the radical ACF composition, and therefore, their detailed description will not be repeated herein.

The Curing Composition:

The curing composition of the epoxy ACF composition may include at least one epoxy component, i.e., an epoxy monomer, an epoxy oligomer, and/or and epoxy resin, and at least one heat curing agent.

The epoxy component of the epoxy ACF composition may be aliphatic or alicyclic, and may include one or more of bisphenol, novolac, and/or glycidyl. The epoxy component may be solid at room temperature, e.g., phenol novolac, cresol novolac, an epoxy component having a dicyclopentadiene in a main chain, polymerized or modified bisphenol A or F, and so forth, and/or may be a liquid at room temperature, e.g., bisphenol A and/or F. The epoxy component may include a soluble epoxy compound, e.g., dimer acid modified epoxy resin, an epoxy resin having propylene glycol in a main chain, urethane modified epoxy resin, and so forth. Examples of commercially available epoxy components include DER-331 (Dow Chemical), YDCN-500-80P (Kukdo Chemical), YDCN-500-90P (Kukdo Chemical), YP-50 (Tohto Chemical), PKFE (InChemRez), and so forth.

The heat curing agent of the epoxy curing composition may be any heat curing agent suitable for epoxy resins as determined by one of ordinary skill in the art. Examples of the heat curing agent may include an acid anhydride based compound, an amine-based compound, an imidazole-based compound, and/or a hydrazide-based compound. The heat curing agent may be present in the ACF composition in an amount of about 0.1 wt % to about 15 wt % of the ACF composition.

The ACF composition according to an embodiment of the present invention may further include about 0.01 wt % to about 10 wt % of at least one additive, e.g., a polymerization inhibitor, an antioxidant, a heat stabilizer, and/or a curing accelerator, in order to provide predetermined physical properties to the ACF composition.

Examples of the polymerization inhibitor may include one or more of hydroquinone, hydroquinone monomethyl ether, p-benzoquinone, and/or phenothiazine. The antioxidant may be used to prevent thermally induced oxidation and to provide heat stability to the ACF composition, and may include a branched phenolic or hydroxy cinnamate compound, e.g., tetrakis-(methylene-(3,5-di-t-butyl-4-hydrocinnamate) methane; 3,5-bis(1,1-dimethylethyl)-4-hydroxy benzene propanoic acid thiol di-2,1-ethanediyl ester; octadecyl 3,5-di-t-butyl-4-hydroxy hydrocinnamate (commercially available from Ciba); and/or 2,6-di-t-p-methylphenol. The curing accelerator may include one or more of a solid-phase imidazole based accelerator and/or a solid- and liquid-phase amine based curing accelerator.

An exemplary method of forming the ACF composition may include dissolving the thermoplastic resin and the SAN in an organic solvent, i.e., any suitable organic solvent as determined by one of ordinary skill in the art, to form a first solution, stirring the first solution with the curing composition, i.e., either radical or epoxy, and the conductive particles for a predetermined time period to form a second solution, applying the second solution onto a release film to a thickness of about 10 µm to about 50 µm, and drying the release film for a predetermined period of time to evaporate the organic solvent in order to form a single layered ACF. The above process may be repeated a multiple number of times in to form a multi-layered ACF.

EXAMPLES

Example 1 a binder of an ACF composition was prepared by mixing 10 wt % of nitrile butadiene rubber (NBR) based resin (N-21, Nippon Zeon) dissolved in toluene/methyl ethyl ketone azeotropic solvent (30 vol %), 10 wt % of acryl-based copolymer resin (KLS-1022, Fujikura Kasei) dissolved in methyl ethyl ketone (25 vol %), 15 wt % of SAN copolymer resin (Luran S 777K, BASF) dissolved in toluene/methyl ethyl ketone azeotropic solvent (50 vol %), and 10 wt % of cresol novolac type epoxy resin (YDCN-500-80P, Kukdo Chemical) dissolved in toluene (40 vol %).

Next, a radical curing composition was added to the binder by adding 38 wt % of urethane acrylate oligomer (Miramer J-01, Miwon Commercial), 2 wt % of 2-methacryloyloxyethyl phosphate, 5 wt % of pentaerythritol tri-acrylate, 6 wt % of 1,6-hexanediol di-acrylate, 0.5 wt % of benzoyl peroxide, and 0.5 wt % of lauryl peroxide. Finally, 3 wt % of insulation-coated gold particles (NCI) having a diameter of 5 µm were added to the mixture to form an ACF composition.

Example 2 a binder of an ACF composition was prepared according to the method of Example 1, with the exception of using 20 wt % of acryl-based resin (KLS-1035, Fujikura Kasei) dissolved in toluene/methyl ethyl ketone (20 vol %), instead of 10 wt % NBR and 10 wt % of acryl-based copolymer (KLS-1022, Fujikura Kasei) in methyl ethyl ketone (25 vol %).

Next, a radical curing composition was added to the binder by adding 20 wt % of epoxy acrylate oligomer (EB-600, SK Cytec), 20 wt % of fluorene-based epoxy acrylate monomer (BPEF-A, Osaka Gas), 2 wt % of 2-methacryloyloxyethyl phosphate, 3 wt % of pentaerythritol tri-acrylate, 6 wt % of 1,6-hexanediol di-acrylate, 0.5 wt % of benzoyl peroxide, and 0.5 wt % of lauryl peroxide. Finally, 3 wt % of insulation-coated gold particles (NCI) having a diameter of 5 µm were added to the mixture to form an ACF composition.

Example 3 a binder of an ACF was prepared by mixing 15 wt % of NBR based resin (N-34, Nippon Zeon) dissolved in toluene/methyl ethyl ketone azeotropic solvent (30 vol %), 20 wt % of SAN copolymer resin (SAN 350, Kumho Petrochemical) dissolved in toluene/methyl ethyl ketone azeotropic solvent (50 vol %), and 10 wt % of cresol novolac type epoxy resin (YDCN-500-90P, Kukdo Chemical) dissolved in toluene (40 vol %).

Next, a radical curing composition was added to the binder by adding 12 wt % of fluorene-based urethane acrylate oligomer [obtained by reacting 4,4-(9-fluorenylidene-bis-2-phenoxyethanol) (Aldrich) with 2,4-trilene diisocyanate (Aldrich) in the presence of a catalyst and then with 2-hydroxypropyl acrylate], 30 wt % of epoxy acrylate oligomer (EB-600, SK Cytec), 3 wt % of 2-methacryloyloxyethyl phosphate, 3 wt % of pentaerythritol tri-acrylate, 3 wt % of 2-hydroxyethyl acrylate, 0.5 wt % of benzoyl peroxide, and 0.5 wt % of lauryl peroxide. Finally, 3 wt % of insulation-coated gold particles (NCI) having a diameter of 5 µm were added to the mixture to form an ACF composition.

Example 4 a binder of an ACF was prepared by mixing 20 wt % of acryl-based resin (SG-280, Nagase ChemteX) dissolved in methyl ethyl ketone (20 vol %), 25 wt % of SAN copolymer resin (Luran SAN, Bayer) dissolved in toluene/methyl ethyl ketone azeotropic solvent (40 vol %), and 5 wt % of cresol novolac type epoxy resin (YDCN-500-90P, Kukdo Chemical) dissolved in toluene (40 vol %).

Next, a radical curing composition was added to the binder by adding 20 wt % of urethane acrylate oligomer (EB-4883, SK Cytec), 17 wt % of urethane acrylate oligomer (UV-3000B, Nippon Synthetic Chemical), 3 wt % of 2-methacryloyloxyethyl phosphate, 3 wt % of pentaerythritol tri-acrylate, 3 wt % of 2-hydroxyethyl acrylate, 0.5 wt % of benzoyl peroxide, and 0.5 wt % of lauryl peroxide. Finally, 3 wt % of insulation-coated gold particles (NCI) having a diameter of 5 µm were added to the mixture to form an ACF composition.

Example 5 a binder of an ACF was prepared by mixing 20 wt % of NBR based resin (N-34, Nippon Zeon) dissolved in toluene/methyl ethyl ketone (30 vol %), 20 wt % of SAN copolymer resin (AP-61, Cheil Industries) dissolved in toluene/methyl ethyl ketone azeotropic solvent (40 vol %), and 10 wt % of cresol novolac type epoxy resin (YDCN-500-90P, Kukdo Chemical) dissolved in toluene (40 vol %).

Next, a radical curing composition was added to the binder by adding 20 wt % of urethane acrylate oligomer (UA-160™, Shin-Nakamura), 20 wt % of epoxy acrylate oligomer (EB-3701, SK Cytec), 2 wt % of pentaerythritol hexa-acrylate, 2 wt % of 2-methacryloyloxyethyl phosphate, 2 wt % of 2-hydroxyethyl acrylate, 0.5 wt % of benzoyl peroxide, and 0.5 wt % of lauryl peroxide. Finally, 3 wt % of insulation-coated gold particles (NCI) having a diameter of 5 µm were added to the mixture to form an ACF composition.

Example 6 a binder of an ACF was prepared by mixing 25 wt % of NBR based resin (N-34, Nippon Zeon) dissolved in toluene/methyl ethyl ketone (30 vol %), 15 wt % of SAN copolymer resin (AP-TJ, Cheil Industries) dissolved in toluene/methyl ethyl ketone azeotropic solvent (40 vol %), and 10 wt % of cresol novolac type epoxy resin (YDCN-500-80P, Kukdo Chemical) dissolved in toluene (40 vol %).

Next, a radical curing composition was added to the binder by adding 15 wt % of fluorene-based urethane acrylate oligomer used in Example 3, 25 wt % of epoxy acrylate oligomer (EB-3701, SK-UCB), 2 wt % of 2-methacryloyloxyethyl phosphate, 3 wt % of pentaerythritol tri-acrylate, 1 wt % of 2-hydroxyethyl acrylate, 0.5 wt % of benzoyl peroxide, 0.5 wt % of lauryl peroxide. Finally, 3 wt % of insulation-coated gold particles (NCI) having a diameter of 5 μm were added to the mixture to form an ACF composition.

Example 7 a binder of an ACF was prepared according to the method of Example 5, with the exception of using 5 wt % of phenoxy resin (E-4275, JER) dissolved in toluene (40 vol %), instead of cresol novolac.

Next, an epoxy curing composition was added to the binder by adding 27 wt % of bisphenol-A type epoxy resin (DER-331, Dow Chemical), 17 wt % of cresol novolac type epoxy resin (YDCN-500-80P, Kukdo Chemical), 5 wt % of solid-phase modified imidazole curing agent (PN-21, Aginomoto), and 3 wt % of solid-phase imidazole accelerator (EH-3293, Adeka). Finally, 3 wt % of insulation-coated 5 gold particles (NCI) having a diameter of 5 μm were added to the mixture to form an ACF composition.

Example 8 a binder of an ACF was prepared by mixing 15 wt % of NBR based resin (N-34, Nippon Zeon) dissolved in toluene/methyl ethyl ketone (30 vol %), 20 wt % of SAN copolymer resin (AP-81, Cheil Industries) dissolved in toluene/methyl ethyl ketone azeotropic solvent (40 vol %), and 10 wt % of phenoxy resin (PKFE, InChemRez) dissolved in toluene (40 vol %) for 30 minutes at 80° C.

Next, an epoxy curing composition was added to the binder by adding 24 wt % of bisphenol-A type epoxy resin (YL-980, JER), 20 wt % of cresol novolac type epoxy resin (YDCN-500-90P, Kukdo Chemical), 8 wt % of solid-phase modified imidazole curing agent (PN-30, Aginomoto), and 3 wt % of solid-phase imidazole accelerator (EH-3293, Adeka). Finally, 3 wt % of insulation-coated gold particles (NCI) having a diameter of 5 μm were added to the mixture to form an ACF composition.

Comparative Example 1 a binder of an ACF composition was prepared by mixing 20 wt % of NBR based resin (N-34, Nippon Zeon) dissolved in toluene/methyl ethyl ketone (30 vol %), 15 wt % of acryl-based resin (SG-280, Nagase ChemteX) dissolved in toluene (30 vol %), and 10 wt % of cresol novolac type epoxy resin (YDCN-500-90P, Kukdo Chemical) dissolved in toluene (40 vol %). The radical curing composition and gold particles were used according to the method of Example 1.

Comparative Example 2 a binder of an ACF composition was prepared by mixing 10 wt % of NBR based resin (N-34, Nippon Zeon) dissolved in toluene/methyl ethyl ketone (30 vol %), 25 wt % of acryl-based resin (KLS-1025, Fujikura Kasei) dissolved in toluene (30 vol %), and 12 wt % of cresol novolac type epoxy resin (YDCN-500-90P, Kukdo Chemical) dissolved in toluene (40 vol %).

Next, a radical curing composition was added to the binder by adding 33 wt % of epoxy acrylate oligomer (SP-4010, Showa Highpolymer), 12 wt % of pentaerythritol hexa-acrylate, 2 wt % of 2-methacryloyloxyethyl phosphate, 2 wt % of 2-hydroxyethyl acrylate, 0.5 wt % of benzoyl peroxide, and 0.5 wt % of lauryl peroxide. Finally, 3 wt % of insulation-treated gold Au particles (NCI) having a diameter of 5 μm were added to the mixture to complete the ACF composition.

Comparative Example 3 a binder of an ACF composition was prepared by mixing 25 wt % of NBR based resin (N-34, Nippon Zeon) dissolved in toluene/methyl ethyl ketone (30 vol %), 15 wt % of acryl-based resin (KMM-34, Fujikura Kasei) dissolved in toluene (30 vol %), and 10 wt % of cresol novolac type epoxy resin (YDCN-500-90P, Kukdo Chemical) dissolved in toluene (40 vol %). The radical curing composition and gold particles were used according to the method of Example 6, with the exception of using a commercially available urethane acrylate oligomer (UV-3000B, Nippon Synthetic Chemical) instead of the fluorene-based urethane acrylate oligomer.

Comparative Example 4 a binder of an ACF was prepared by mixing 20 wt % of NBR based resin (N-34, Nippon Zeon) dissolved in toluene/methyl ethyl ketone (30 vol %), 20 wt % of acryl resin (SG-80H, Fujikura Kasei) dissolved in toluene (40 vol %), and 5 wt % of phenoxy resin (PKFE, InChemRez) dissolved in toluene (40 vol %).

Next, a radical curing composition was added to the binder by adding 27 wt % of bisphenol-A type epoxy resin (DER-331, Dow Chemical), 17 wt % of cresol novolac type epoxy resin (YDCN-500-80P, Kukdo Chemical), 5 wt % of solid-phase modified imidazole curing agent (PN-21, Aginomoto), and 3 wt % of solid-phase imidazole accelerator (EH-3293, Adeka). Finally, 3 wt % of insulation-treated gold particles (NCI) having a diameter of 5 μm were added to the mixture to complete the ACF composition.

Each of the ACF compositions formed in Examples 1-8 and Comparative Examples 1-4 was stirred at room temperature (25° C.) for 60 minutes. Each composition was applied onto a silicon release-treated polyethylene base film to a thickness of 20 μm by a casting knife. The ACF composition was dried for 10 minutes at 50° C. to complete formation of each ACF. Each of the completed ACFs was kept at room temperature for 1 hour.

Next, each of the completed ACFs was evaluated in terms of adhesion and contact resistance reliability under different conditions. More specifically, each ACF was used to electrically connect two indium tin oxide (ITO) glass substrates, and to form chip on film (COF) and TCPs. Each electrical connection was made by applying pressure of 1 MPa for 1 second at 160° C. to provide initial bonding, followed by applying pressure of 3 MPa for additional 5 seconds at 180° C. to strengthen the initial bonding. Seven (7) samples were prepared for each ACF of Examples 1-8 and Comparative Examples 1-4.

Adhesion and contact resistance were tested under room temperature and humidity conditions by performing 90° peel strength test and a 4-probe method, respectively. Adhesion and contact resistance were tested again by the same methods under high temperature and humidity conditions, i.e., after samples were left at 85° C. and R.H. 85% for a duration of 1000 hours. Adhesion and contact resistance testing was repeated to evaluate thermal shock reliability by changing temperature from −40° C. to 80° C. for 1000 cycles. Result are reported Tables 1-2 below.

TABLE 1

Initial adhesion and reliability evaluation result

|  | Initial Adhesion (g/cm) | High Temperature/ Humidity Adhesion (g/cm) | Thermal Shock Adhesion (g/cm) |
|---|---|---|---|
| Example 1 | 950 | 1064 | 1120 |
| Example 2 | 983 | 1066 | 1069 |
| Example 3 | 942 | 1019 | 1048 |
| Example 4 | 979 | 1002 | 1001 |
| Example 5 | 951 | 968 | 1082 |
| Example 6 | 1024 | 1093 | 1099 |
| Example 7 | 979 | 1140 | 1227 |
| Example 8 | 1091 | 1224 | 1290 |
| Comparative Example 1 | 857 | 925 | 943 |
| Comparative Example 2 | 916 | 948 | 950 |
| Comparative Example 3 | 896 | 950 | 951 |
| Comparative Example 4 | 930 | 955 | 949 |

As illustrated in Table 1, ACFs in Examples 1-8, i.e., ACFs formed according to embodiments of the present invention, exhibited higher adhesion, as compared to ACFs in Comparative Examples 1-4, i.e., binder including no SAN copolymer.

TABLE 2

Initial contact resistance and reliability evaluation result

|  | Initial Contact Resistance (Ω) | High Temperature/ Humidity Contact Resistance (Ω) | Thermal Shock Contact Resistance (Ω) |
|---|---|---|---|
| Example 1 | 0.68 | 1.10 | 1.00 |
| Example 2 | 0.65 | 1.10 | 1.21 |
| Example 3 | 0.55 | 1.02 | 1.00 |
| Example 4 | 0.60 | 1.01 | 0.94 |
| Example 5 | 0.50 | 0.95 | 0.97 |
| Example 6 | 0.69 | 0.99 | 0.91 |
| Example 7 | 0.63 | 0.94 | 1.00 |
| Example 8 | 0.66 | 1.00 | 0.99 |
| Comparative Example 1 | 0.73 | 1.49 | 1.47 |
| Comparative Example 2 | 0.77 | 1.37 | 1.45 |
| Comparative Example 3 | 0.69 | 1.20 | 1.40 |
| Comparative Example 4 | 0.81 | 1.48 | 1.35 |

As illustrated in Table 2, the ACFs in Examples 1-8, i.e., ACFs formed according to embodiments of the present invention, exhibited lower contact resistance, as compared to ACFs in Comparative Examples 1-4, i.e., binder including no SAN copolymer. This confirms that ACFs formed in accordance with embodiments of the present invention, i.e., including SAN copolymer resin, may exhibit improved physical properties at room temperature/humidity, high temperature/humidity, and under thermal shock conditions, as compared to conventional ACFs, e.g., ACFs including no SAN copolymer.

An ACF formed of a composition according to an embodiment of the present invention, i.e., an ACF having a binder including a SAN copolymer resin, may be advantageous in minimizing or preventing short circuits due to superior adhesion, insulation, and reliability imparted thereto by the molecular structures of the styrene and acrylonitrile. As such, the ACF according to embodiments of the present invention may be advantageous in small-sized circuit patterns, thereby contributing to development of high-integration and high-density semiconductor devices, e.g., display devices.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An anisotropic conductive film (ACF) composition, comprising:
    a binder including a thermoplastic resin and a styrene-acrylonitrile (SAN) copolymer resin;
    a curing composition; and
    conductive particles, wherein:
    the curing composition includes:
        at least one epoxy component, and
        at least one heat curing agent.

2. The ACF composition as claimed in claim 1, wherein:
    the thermoplastic resin is in an amount of about 5 wt % to about 50 wt % by weight of the ACF composition,
    the SAN copolymer resin is in an amount of about 5 wt % to about 50 wt % by weight of the ACF composition,
    the epoxy component is in an amount of about 1 wt % to about 80 wt % by weight of the ACF composition,
    the heat curing agent is in an amount of about 0.1 wt % to about 15 wt % by weight of the ACF composition; and
    the conductive particles are in an amount of about 0.01 wt % to about 20 wt % by weight of the ACF composition.

3. The ACF composition as claimed in claim 1, wherein the epoxy component includes one or more of a bisphenol epoxy, a novolac epoxy, a glycidyl epoxy, an aliphatic epoxy, and/or an alicyclic epoxy.

4. The ACF composition as claimed in claim 1, wherein the epoxy component includes at least one or more of a solid-phase epoxy, a liquid-phase epoxy, and/or a soluble epoxy.

5. The ACF composition as claimed in claim 1, wherein the heat curing agent includes one or more of an acid anhydride-based compound, an amine-based compound, an imidazole-based compound, and/or a hydrazide-based compound.

* * * * *